(12) United States Patent
Fraczak et al.

(10) Patent No.: US 10,770,656 B2
(45) Date of Patent: Sep. 8, 2020

(54) METHOD FOR MANUFACTURING PHASE CHANGE MEMORY

(71) Applicants: International Business Machines Corporation, Armonk, NY (US); ULVAC Technologies, Inc., Methuen, MA (US)

(72) Inventors: Gloria Wing Yun Fraczak, Queens, NY (US); Matthew Brightsky, Pound Ridge, NY (US); Chung Hon Lam, Yorktown Heights, NY (US); Fabio Carta, Yorktown Heights, NY (US); Robert Bruce, White Plains, NY (US); Takeshi Masuda, Yorktown Heights, NY (US); Koukou Suu, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/136,464

(22) Filed: Sep. 20, 2018

(65) Prior Publication Data
US 2020/0098986 A1   Mar. 26, 2020

(51) Int. Cl.
*H01L 45/00* (2006.01)

(52) U.S. Cl.
CPC ........... *H01L 45/144* (2013.01); *H01L 45/06* (2013.01); *H01L 45/1253* (2013.01); *H01L 45/1286* (2013.01); *H01L 45/1683* (2013.01)

(58) Field of Classification Search
CPC ..... H01L 45/16; H01L 45/126; H01L 45/124; H01L 45/143; H01L 45/144; H01L 45/148; H01L 45/1675; H01L 45/00; H01L 45/02; H01L 45/20; H01L 45/02417; H01L 45/02485; H01L 45/02568; H01L 31/0324; H01L 45/06; H01L 45/1253; H01L 45/1286; H01L 45/1683
USPC ........................................................ 257/4
See application file for complete search history.

(56) References Cited

U.S. PATENT DOCUMENTS

| | | |
|---|---|---|
| 7,638,786 B2 | 12/2009 | Matsui et al. |
| 7,642,123 B2 | 1/2010 | Lung |
| 8,243,494 B2 | 8/2012 | Lai et al. |
| 8,445,318 B2 | 5/2013 | Shin |
| 8,680,501 B2 | 3/2014 | Schrott et al. |
| 9,543,510 B2 | 1/2017 | Miao et al. |
| 2010/0227457 A1 | 9/2010 | An et al. |
| 2011/0108792 A1 | 5/2011 | Lam et al. |
| 2012/0049144 A1* | 3/2012 | Franceschini ....... H01L 45/1226 257/3 |
| 2014/0110656 A1* | 4/2014 | Liang .................... H01L 45/06 257/2 |

* cited by examiner

*Primary Examiner* — Chuong A Luu
(74) *Attorney, Agent, or Firm* — Paterson + Sheridan, LLP

(57) ABSTRACT

Method(s) and apparatuses for forming a phase change memory. A method includes: forming a crystalline phase-change layer at a first position in along a surface of a first semiconductor layer, and forming an amorphous phase-change layer at a second position along the surface of a second semiconductor layer, wherein the crystalline phase-change layer and the amorphous phase-change layer are in contact.

18 Claims, 9 Drawing Sheets

METHOD FOR MANUFACTURING PHASE CHANGE MEMORY

BACKGROUND

This disclosure relates to a method for manufacturing a phase-change memory.

A phase-change layer reversibly changes between an amorphous state and a crystalline state. The resistance is higher in the amorphous state than in the crystalline state. A phase-change memory outputs electrical signals corresponding to the resistance of the phase-change layer so that information associated with each state can be read from the phase-change memory. Further, the phase-change memory receives electrical signals for changing the state of the phase-change layer so that information associated with each state can be written to the phase-change memory. Japanese Laid-Open Patent Publication Nos. 2008-182230 and 2008-172221 each describe the structure of the phase-change memory.

When manufacturing a phase-change memory, a recess that is formed in an insulation layer is filled with a phase-change layer. The filling properties of a phase-change material are more superior in an amorphous state than in a crystalline state. Thus, the phase-change layer is usually in an amorphous state when the recess of the insulation layer is filled with the phase-change layer. Then, the phase-change layer in the recess is annealed and shifted to the crystalline state. However, the film density is lower in the amorphous state than in the crystalline state. Thus, the phase-change layer contracts as the phase-change layer shifts to the crystalline state. This may form a void in the recess of the insulation layer.

SUMMARY

One embodiment of the present disclosure is a method for manufacturing a phase-change memory. The method includes forming a crystalline phase-change layer at a first position in a recess of an insulation layer and forming an amorphous phase-change layer at a second position, which differs from the first position, in the recess.

Another embodiment of the present disclosure is a method that includes: forming a crystalline phase-change layer at a first position in along a surface of a first semiconductor layer, and forming an amorphous phase-change layer at a second position along the surface of a second semiconductor layer, wherein the crystalline phase-change layer and the amorphous phase-change layer are in contact.

Yet another embodiment of the present disclosure is a structure that includes: a single polycrystalline phase-change layer including i) a first portion that is polycrsytalline with a smaller grain size than ii) a second portion that is polycrystalline, wherein the second portion comprises the majority of the single polycrsytalline phase-change layer, and at least one electrode in contact with the single polycrsytalline phase-change layer.

DETAILED DESCRIPTION

Figure 1:
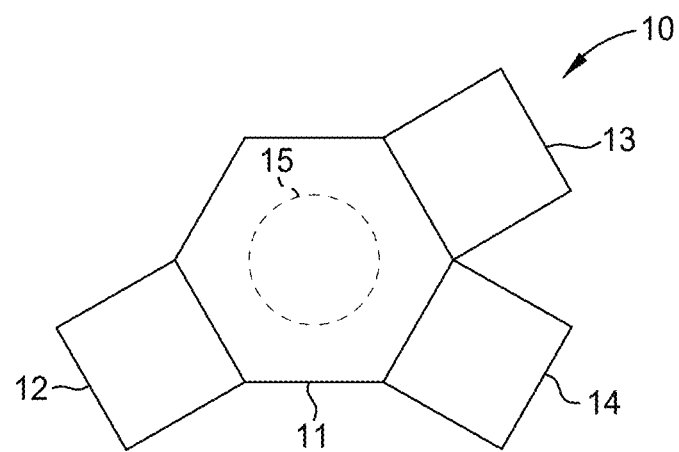
FIG. 1 is a block diagram illustrating one example of an apparatus for manufacturing a phase-change memory in accordance with at least one embodiment of the present disclosure.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure can be practiced with viable alternative process options without these specific details. In other instances, well-known structures or processing steps have not been described in detail in order to avoid obscuring the various embodiments of the present disclosure.

Manufacturing phase-change memory presents using amorphous or crystalline materials presents one or more difficulties. Forming one or more layers of amorphous material over one or more semiconductor layers in the phase-change memory context can result in shrinkage when heating or annealing is applied, whereas using solely crystalline, e.g. polycrystalline material, void defects after deposition of the material occurs. One or more embodiments offer methods and structures to address these deficiencies.

One embodiment of a method for manufacturing a phase-change memory includes forming a crystalline phase-change layer at a first position along a surface of an insulation layer and forming an amorphous phase-change layer at a second position, which differs from the first position, along the surface. In an embodiment, of a method for manufacturing a phase-change memory includes forming a crystalline phase-change layer at a first position in a recess of an insulation layer and forming an amorphous phase-change layer at a second position, which differs from the first position, in the recess.

In an embodiment, the amorphous phase-change layer and the crystalline phase-change layer are formed at different positions in the recess. Thus, compared to when forming only an amorphous phase-change layer, the difference in the volume of the phase-change layer is decreased between when the phase-change layer is formed and when the entire phase-change layer is crystallized. This obviates the formation of a void in the region (recess) filled with the phase-change layer that would be caused by a decrease in the volume of the phase-change layer.

In an embodiment, the formation of the amorphous phase-change layer can be performed after the formation of the crystalline phase-change layer.

In an embodiment, even when a void is formed in the crystalline phase-change layer, the void is filled with the amorphous phase-change layer. This completely fills the region (recess) where the phase-change layer is formed.

In an embodiment, the formation of the crystalline phase-change layer can be performed after the formation of the amorphous phase-change layer.

In an embodiment, compared to when a crystalline phase-change layer is formed when there is no amorphous phase-change layer, differences in the crystalline nucleation, as described in at least on example provided for above, are reduced during the initial formation stage of the crystalline phase-change layer. This allows for the formation of a crystalline phase-change layer having a higher degree of flatness and thus obviates the formation of a void in the region (recess) filled with the phase-change layer.

In an embodiment, the formation of the amorphous phase-change layer may include forming a first amorphous phase-change layer. In this case, subsequent to the formation of the crystalline phase-change layer, the method may further include forming a second amorphous phase-change layer in the recess at a third position that differs from the first position and the second position. After the formation of the crystalline phase-change layer that has an increased degree of flatness, the second amorphous phase-change layer is formed on the crystalline phase-change layer. Thus, even when a void is formed in the crystalline phase-change layer, the void is filled with the second amorphous phase-change layer. This further obviates the formation of a void in the region filled with the phase-change layer.

In an embodiment, the formation of the crystalline phase-change layer and the formation of the amorphous phase-change layer fill a cavity defined by the recess with the crystalline phase-change layer and the amorphous phase-change layer. In an embodiment, the amorphous phase-change layer and the crystalline phase-change layer are formed so that the amorphous phase-change layer has a smaller volume than the crystalline phase-change layer in the cavity of the recess.

This configuration decreases the difference in volume between when the phase-change layer is formed and when the entire phase-change layer is crystallized, compared to a configuration in which the crystalline phase-change layer has a smaller volume than the amorphous phase-change layer. Thus, the formation of a void is obviated in the region (recess) filled with the phase-change layer.

In an embodiment, the formation of the crystalline phase-change layer includes forming the crystalline phase-change layer that differs in composition from the amorphous phase-change layer but includes elements that are also included in the amorphous phase-change layer. The crystalline phase-change layer and the amorphous phase-change layer can be formed from different compositions. This increases the freedom for the composition of the entire phase-change layer.

In an embodiment, the insulation layer is set to have a higher temperature when the crystalline phase-change layer is formed than when the amorphous phase-change layer is formed. The crystalline phase-change layer and the amorphous phase-change layer can be formed by changing the temperature of the insulation layer.

At least one embodiment of a method for manufacturing a phase-change memory will now be described with reference to FIGS. 1 to 15, included but not limited in the description are an apparatus for manufacturing a phase-change memory, a second film formation chamber, a method for manufacturing the phase-change memory, a method for forming a phase-change film, and experimental examples, all of which will be described hereafter.

FIG. 1 illustrates at least one embodiment for a manufacturing apparatus 10 for a phase-change memory. The phase-change memory manufacturing apparatus 10 includes a transport chamber 11, a load-unload chamber 12, a first film formation chamber 13, a second film formation chamber 14, and a transport robot 15. The transport chamber 11 is connected to the load-unload chamber 12, the first film formation chamber 13, and the second film formation chamber 14. The manufacturing apparatus 10 is configured to reduce the pressure of a processing zone defined by the chambers 11 to 14 to a predetermined pressure.

A non-processed film formation subject is loaded into the load-unload chamber 12 from the outside of the manufacturing apparatus 10. Further, a processed film formation subject is unloaded from the load-unload chamber 12 out of the manufacturing apparatus 10.

A film formation subject includes, for example, a silicon substrate, a first insulation layer, and a second insulation layer. An element such as a transistor is formed on the silicon substrate. The first insulation layer is located on the silicon substrate. A lower electrode is arranged in the first insulation layer. The lower electrode extends in the direction in which the silicon substrate and the first insulation layer are stacked. For example, the lower electrode is located at a position overlapping the element on the silicon substrate. The second insulation layer is located on the first insulation layer and includes a recess extending in a direction in which the first insulation layer and the second insulation layer overlap each other. For example, the recess extends through the second insulation layer at a location overlapping the lower electrode.

The first film formation chamber 13 forms a liner layer on the film formation subject. One example of a liner layer is a metal nitride layer. In the first film formation chamber 13, for example, reactive sputtering, atomic layer deposition, or chemical vapor deposition is performed to form the liner layer.

The second film formation chamber 14 forms a phase-change layer on the film formation subject that has been processed in the first film formation chamber 13. In the second film formation chamber 14, for example, chemical vapor deposition (CVD) is performed to form the phase-change layer.

The transport robot 15 is located in the transport chamber 11. The transport robot 15 transports the film formation subject from the load-unload chamber 12 to the first film formation chamber 13. Further, the transport robot 15 transports the film formation subject from the first film formation chamber 13 via the transport chamber 11 to the second film formation chamber 14. The transport robot 15 also transports the processed film formation subject, that is, the film formation subject on which the phase-change layer has been formed, from the second film formation chamber 14 via the transport chamber 11 to the load-unload chamber 12.

The film formation subject that has been processed in the first film formation chamber 13 is transported, without being exposed to the atmosphere, to the second film formation chamber 14 and processed in the second film formation chamber 14. This limits oxidation of the surface of the liner layer and limits the generation of a parasitic capacitor or a parasitic resistance in the film formation subject that would be caused by such oxidation.

Figure 2:
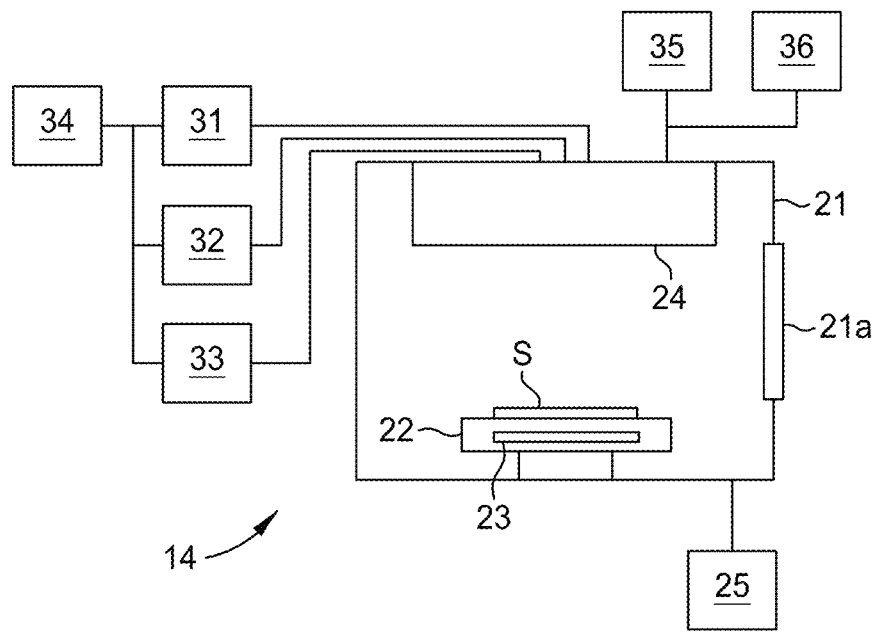
FIG. 2 is a block diagram illustrating one example of a second film formation chamber in the manufacturing apparatus of FIG. 1 and in accordance with at least one embodiment of the present disclosure.

FIG. 2 illustrates a film formation chamber 14 will now be described with reference to FIG. 2, wherein in an embodiment it can be second film formation chamber in relation to the first film formation chamber. The second film formation chamber 14 described hereafter is an example that forms a germanium antimony telluride ($Ge_xSb_yTe_z$:GST) layer as the phase-change layer, although other materials are contemplated and consistent with the techniques described herein.

Referring to FIG. 2, the second film formation chamber 14 includes a box-shaped vacuum tank 21 including a load-unload port 21a. A film formation subject S is loaded into the vacuum tank 21 through the load-unload port 21a. After the formation of the phase-change layer, the film formation subject S is unloaded out of the vacuum tank 21 through the load-unload port 21a.

A stage 22 that supports the film formation subject S is located in a processing area defined in the vacuum tank 21. The stage 22 includes a heater 23 that heats the film formation subject S. Further, a shower head 24 is located in the processing area at a position opposing the stage 22. A discharge unit 25 is connected to the vacuum tank 21 to reduce the pressure of the vacuum tank 21 to a predetermined pressure.

The shower head 24 is connected to a first material container 31, a second material container 32, and a third material container 33. By way of non-limiting example, the first material container 31 contains organic metal material including germanium (Ge), the second material container 32 contains organic metal material including antimony (Sb), and the third material container 33 contains organic metal material including telluride (Te). Other suitable examples are possible, including halide-based precursors for GST.

The first material container 31, the second material container 32, and the third material container 33 are connected to a carrier gas supply unit 34. The carrier gas supply unit 34 is connected by separate pipes to the material containers 31 to 33 in order to supply carrier gas to the material containers 31 to 33. The carrier gas is, for example, argon (Ar) gas.

The material containers 31 to 33 each use the Ar gas supplied from the carrier gas supply unit 34 to supply the shower head 24 with material gas including the corresponding organic metal. In the present example, the first material container 31 supplies first material gas that includes Ge, the second material container 32 supplies second material gas that includes Sb, and the third material container 33 supplies third material gas that includes Te.

The shower head 24 is also connected to a reactive gas supply unit 35 that supplies, for example, ammonia ($NH_3$) gas as reactive gas. The shower head 24 is further connected to a diluting gas supply unit 36. The diluting gas supply unit 36 is connected to a pipe that connects the reactive gas supply unit 35 to the shower head 24. The diluting gas supply unit 36 supplies, for example, Ar gas, which is an inert gas. The reactive gas supplied from the reactive gas supply unit 35 is diluted by the diluting gas and supplied to the shower head 24.

In the second film formation chamber 14, when the film formation subject S is loaded into the second film formation chamber 14, the Ar gas supplied from the diluting gas supply unit 36 first adjusts the pressure of the vacuum tank 21 to a predetermined pressure in the range from 2 Torr to 5 Torr.

After the temperature of the film formation subject S is converged to a predetermined temperature, the first material gas, the second material gas, the third material gas, and the reactive gas are supplied into the vacuum tank 21 through the shower head 24. This forms a phase-change layer on the film formation subject S.

FIGS. 3 through FIG. 11 illustrate one or more methods for manufacturing the phase-change memory. At least one embodiment contained in FIGS. 3 to 11 illustrate portions of a first insulation layer and a second insulation layer of the film formation subject S.

One method for manufacturing the phase-change memory includes forming a crystalline phase-change layer in a recess of an insulation layer at a first position and forming an amorphous phase-change layer in the recess at a second position that differs from the first position. The formation of the amorphous phase-change layer is performed after the formation of the crystalline phase-change layer.

Figure 3:
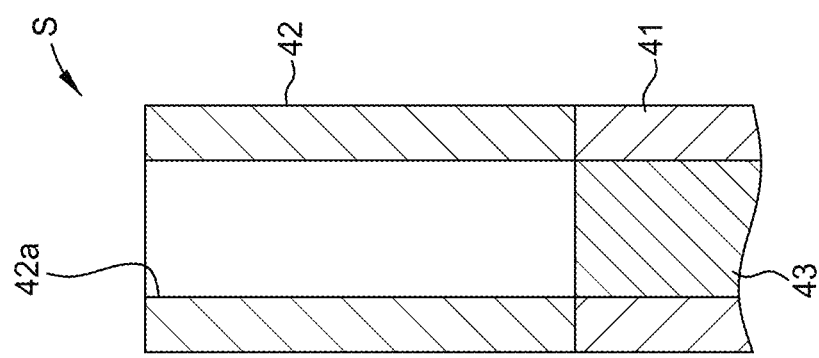
FIG. 3 is a cross-sectional view that illustrates preparation of a film formation subject for a phase-change memory in accordance with at least one embodiment of the present disclosure.

Referring to FIG. 3, the film formation subject S is prepared. The film formation subject S includes a silicon substrate (not illustrated), a first insulation layer 41, and a second insulation layer 42. The first insulation layer 41 is formed on the silicon substrate, and the second insulation layer 42 is formed on the first insulation layer 41. A lower electrode 43 is arranged in the first insulation layer 41. The second insulation layer 42 includes a recess 42a that extends through the second insulation layer 42 in the direction in which the first insulation layer 41 and the second insulation layer 42 are stacked. The recess 42a is located at a position overlapping the lower electrode 43. Further, the recess 42a is filled with a phase-change layer. In this manner, the recess 42a is formed in an insulation layer (first and second insulation layers 41 and 42). In the present example, the recess 42a is formed in the second insulation layer 42 but does not have to be formed in a single insulation layer (second insulation layer 42).

The recess 42a has a diameter of, for example, 20 nm or greater and 50 nm or less. Further, the recess 42a has a depth of, for example, approximately 100 nm-200 nm. The depth of the recess 42a corresponds to the thickness of the second insulation layer 42. The first and second insulation layers 41 and 42 are formed from, for example, silicon nitride (SiN) or silicon oxide ($SiO_2$).

Figure 4:
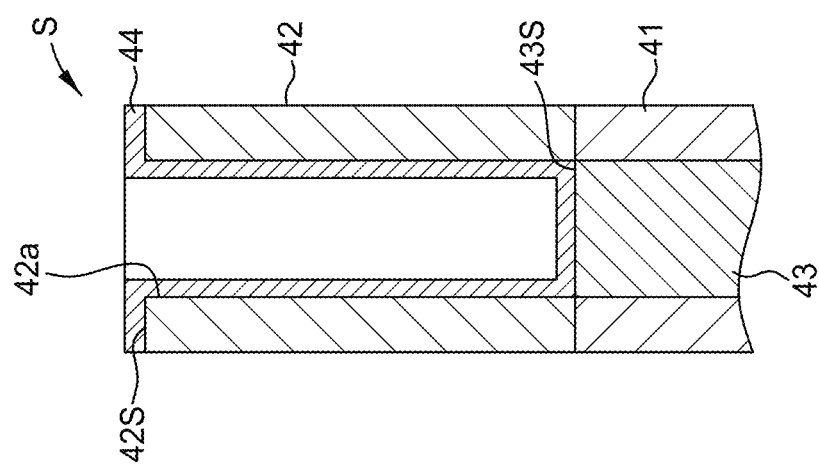
FIG. 4 is a cross-sectional view that illustrates formation of a liner layer for a phase-change memory in accordance with at least one embodiment of the present disclosure.

Referring to FIG. 4, the film formation subject S of FIG. 3 is transported to the first film formation chamber 13 to form a liner layer 44. In the film formation subject S, the second insulation layer 42 includes a surface 42S that is opposite to the surface in contact with the first insulation layer 41. The lower electrode 43 includes a surface 43S that is exposed to the recess 42a of the second insulation layer 42.

The liner layer 44 is formed on the wall surface of the recess 42a (surface of second insulation layer 42 defining recess 42a), the surface 43S of the lower electrode 43, and the surface 42S of the second insulation layer 42. The liner layer 44 is formed from, for example, titanium nitride (TiN) and has a thickness of, for example, approximately 1-10 nm.

When the formation of the liner layer 44 is completed in the first film formation chamber 13, the film formation subject S of FIG. 4 is transported to the second film formation chamber 14 via the transport chamber 11 to form the phase-change layer.

Figure 5:
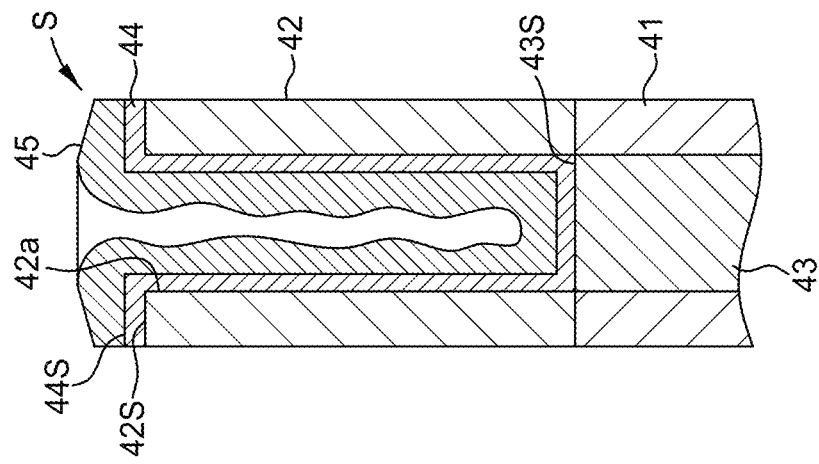
FIG. 5 is a cross-sectional view that illustrates formation of crystalline layer for a phase-change memory in accordance with at least one embodiment of the present disclosure.

Referring to FIG. 5, a crystalline layer 45, which serves as a crystalline phase-change layer, is first formed in the recess 42a at a first position. The crystalline layer 45 can be a polycrystalline layer 45. The liner layer 44 includes a surface 44S. The surface 44S of the liner layer 44 includes a surface opposite to the surface contacting the surface 42S of the second insulation layer 42, a surface opposite to the surface contacting the wall surface of the second insulation layer 42 defining the recess 42a, and the surface opposite to the surface contacting the surface 43S of the lower electrode 43. In other words, the surface 44S of the liner layer 44 incudes a surface portion located inside the recess 42a and a surface portion located outside the recess 42a.

In the one embodiment, the first position in the recess 42a at which the crystalline layer 45 is formed refers to the surface portion (portion of surface 44S) of the liner layer 44 located inside the recess 42a. The crystalline layer 45 is also formed on the surface portion (remaining portion of surface 44S) of the liner layer 44 located outside the recess 42a on the surface 42S of the second insulation layer 42. That is, the crystalline layer 45 is formed on the entire surface 44S of the liner layer 44.

Figure 6:
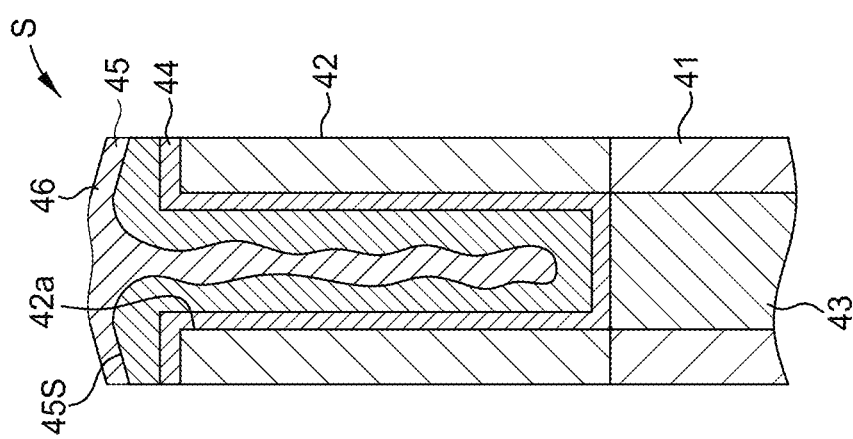
FIG. 6 is a cross-sectional view that illustrates formation of an amorphous layer for a phase-change memory in accordance with at least one embodiment of the present disclosure.
Figure 11:
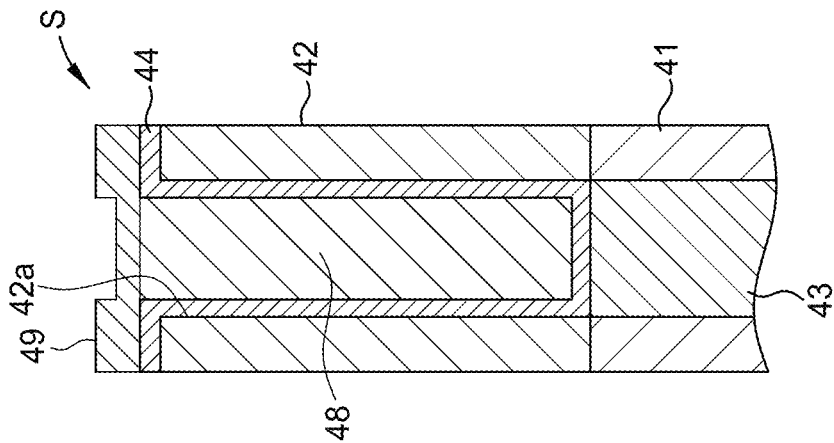
FIG. 11 is a cross-sectional view that illustrates formation of an upper electrode for a phase-change memory in accordance with at least one embodiment of the present disclosure.

Then, referring to FIG. 6, an amorphous layer 46, which serves as an amorphous phase-change layer, is formed in the recess 42a at a second position. The crystalline layer 45 includes a surface 45S. The surface 45S of the crystalline layer 45 includes a surface portion located outside the recess 42a (surface opposite to surface contacting liner layer 44) and a surface portion located inside the recess 42a (surface opposite to surface contacting liner layer 44).

In an embodiment, the second position in the recess 42a at which the amorphous layer 46 is formed refers to the surface portion (portion of surface 45S) of the crystalline layer 45 located inside the recess 42a. The amorphous layer 46 is also formed on the surface portion (remaining portion of surface 45S) located outside the recess 42a. That is, the amorphous layer 46 is formed on the entire surface 45S of the crystalline layer 45. A cavity defined by the recess 42a is filled with the crystalline layer 45 and the amorphous layer 46.

In this manner, the amorphous layer 46 and the crystalline layer 45 are formed at different positions in the recess 42a. Thus, compared to when forming only the amorphous layer 46, the difference in the volume of the phase-change layer is decreased between when the phase-change layer is formed and when the entire phase-change layer is crystallized. This obviates the formation of a void that would be produced in the region (recess) filled with the phase-change layer because of a decrease in the volume of the phase-change layer.

The amorphous layer 46 is formed in the recess 42a after the formation of the crystalline layer 45. Thus, even when a void is formed in the crystalline layer 45, the void is filled with the amorphous layer 46. This completely fills the recess 42a.

In this manner, the formation of the crystalline layer 45, which serves as the crystalline phase-change layer, and the formation of the amorphous layer 46, which serves as the amorphous phase-change layer, fills the cavity of the recess 42a with the crystalline layer 45 and the amorphous layer 46. In an embodiment, the amorphous layer 46 and the crystalline layer 45 are formed so that the amorphous layer 46 has a smaller volume than the crystalline layer 45 inside the recess 42a.

When the amorphous layer 46 has a smaller volume than the crystalline layer 45, the difference in volume between when the phase-change layer is formed and when the entire phase-change layer is crystallized can be decreased as compared to when the crystalline layer 45 has a smaller volume than the amorphous layer 46. This further obviates the formation of a void in the region filled with the phase-change layer.

When the formation of the crystalline layer 45 and the formation of the amorphous layer 46 are completed in the second film formation chamber 14, the film formation subject S of FIG. 6 is unloaded out of the manufacturing apparatus 10 via the transport chamber 11 and the load-unload chamber 12.

Figure 7:
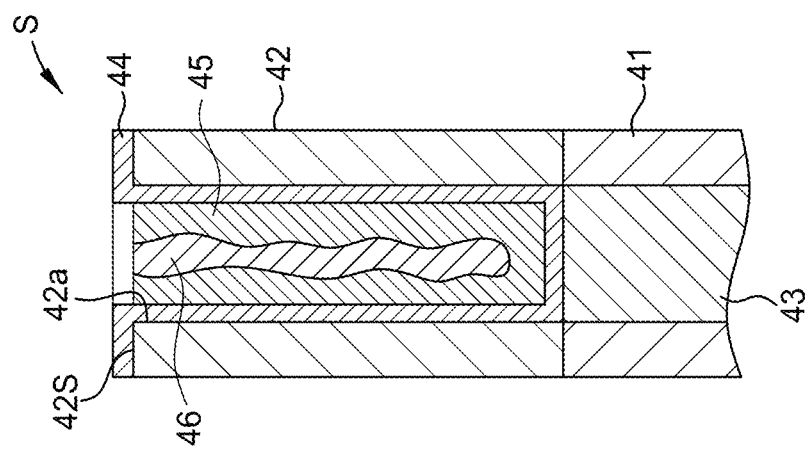
FIG. 7 is a cross-sectional view that illustrates removal of the crystalline layer and the amorphous layer for a phase-change memory in accordance with at least one embodiment of the present disclosure.

Referring to FIG. 7, the portion of the crystalline layer 45 and the portion of the amorphous layer 46 that are located outside the recess 42a and project out of the surface 42S of the second insulation layer 42 are removed.

Figure 8:
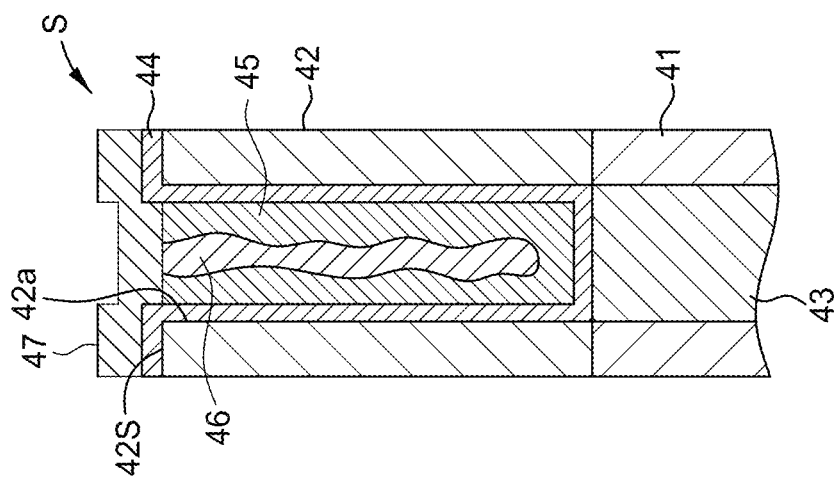
FIG. 8 is a cross-sectional view that illustrates formation of a cap layer for a phase-change memory in accordance with at least one embodiment of the present disclosure.

Referring to FIG. 8, a cap layer 47 is formed to close the opening of the recess 42a. The cap layer 47 covers the portions of the crystalline layer 45 and the portion of the amorphous layer 46 that are exposed from the opening of the recess 42a. The cap layer 47 is formed from, for example, SiN.

Figure 9:
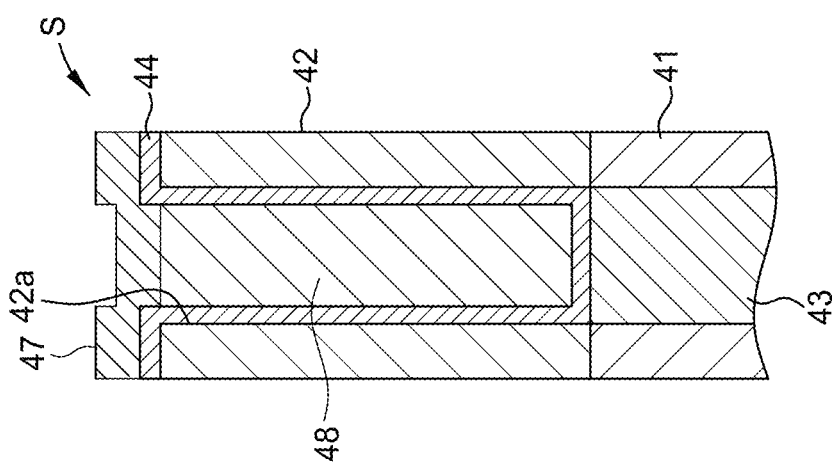
FIG. 9 is a cross-sectional view that illustrates an annealing pursuant to at least one embodiment for a phase-change memory in accordance with at least one embodiment of the present disclosure.

Referring to FIG. 9, the crystalline layer 45 and the amorphous layer 46 are annealed. In an embodiment, when the amorphous phase-change layer is heated to a crystallization temperature or higher, the amorphous phase-change layer changes to a crystalline state. In an embodiment, when the cooling rate is suitable, the crystalline phase-change layer is heated to a temperature higher than or equal to a melting temperature, the phase-change layer changes from a crystalline state to an amorphous state. In another embodiment, if the cooling rate is not suitable, a crystalline state can still form.

In an embodiment, when the crystalline layer 45 and the amorphous layer 46, are heated to the crystallization temperature or higher. This forms a single polycrystalline phase-change layer 48 from the crystalline layer 45 and the amorphous layer 46. In an embodiment, the single polycrystalline phase-change layer 48 is a layer that is entirely polycrystalline. In an embodiment, the single polycrystalline phase-change layer 48 can include two portions with different gran sizes; for example, in an embodiment, if the amorphous layer 46 and the crystalline layer 45 are deposited in roughly equal percentage amounts in relation to the combination 45, 46 that forms the single polycrystalline phase-change layer 48, then the single polycrystalline phase-change layer 48 can form one or more portions with different grain sizes. For example, for a process that heats layers 45, 46 at approximately 400 degrees C. for a time period of thirty minutes to two hours, then less than or equal to ten percent of layer 48 can contain grain sizes less than or equal to 5 nm, e.g. 1 nm-5 nm, and approximately ninety percent of layer 48 can include gran sizes exceeding 5 nm in size. In an embodiment, recess 42a can be less than or equal to 30 nm, and layers 45, 46, and 48 can be less than or equal to 15 nm, with one embodiment the layers 45, 46, and 48 being 1 nm to 5 nm.

Although as shown crystalline layer 45 and amorphous layer 46 are deposited over a recess 42a, any topography can be used include but not limited to a flat surface of another semiconductor layer, such that layer 48 will extend laterally over one or more flat semiconductor layers or any other semiconductor topography.

Figure 10:
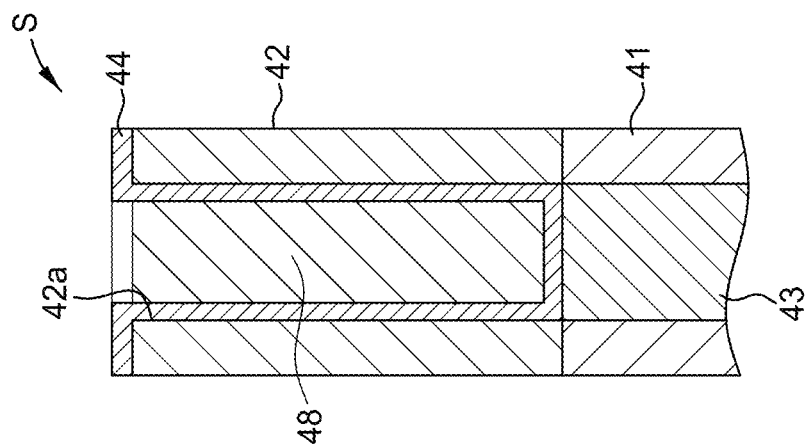
FIG. 10 is a cross-sectional view that illustrates removal of the cap layer for a phase-change memory in accordance with at least one embodiment of the present disclosure.

Referring to FIG. 10, the cap layer 47 is removed. Further, referring to FIG. 11, an upper electrode 49 is formed covering the opening of the recess 42a. The upper electrode 49 covers the portion of the phase-change layer 48 exposed from the opening of the recess 42a. The upper electrode 49 also covers the liner layer 44. This forms the phase-change memory.

One or more methods for forming a phase-change layer will now be described. As illustrated in FIGS. 5 and 6 that form the phase-change layer, the phase-change layer can be formed through any of the methods described herein and below.

A GST layer is formed as the phase-change memory through the methods described below. Further, in the description hereafter, the first material is organic metal including Ge, the second material is organic metal including Sb, and the third material is organic metal including Te. The reactive gas is $NH_3$ gas, and the diluting gas is Ar gas.

In an embodiment, the GST layer is formed when the first material gas, the second material gas, the third material gas, the $NH_3$ gas, and the Ar gas are simultaneously being supplied. Under this condition, a GST layer is obtained more easily as the concentration, e.g. mole fraction, of the $NH_3$ gas can increase relative to the entire concentration of the vacuum tank 21. Further, an GST layer is obtained more easily as the mole fraction of the $NH_3$ gas decreases relative to the entire composition of the vacuum tank 21.

The ratio of the mole fraction of $NH_3$, e.g. concentration of $NH_3$, gas relative to the entire pressure of the vacuum tank 21 correlates to the concentration of the $NH_3$ gas. (The mole fraction of NH3 is the mass of NH3 gas relative to the total mass of the system, which is concentration of NH3 relative to the system). For example, when the GST layer is formed under the conditions listed below, a crystalline GST layer is obtained when the concentration of the $NH_3$ gas is less than 10%, with one embodiment being 7% or less. In contrast, an amorphous GST layer is obtained when the concentration of the $NH_3$ gas is 10% or greater, with one embodiment being 13% or greater.

According to at least one embodiment, film formation conditions are as follows:
Temperature of film formation subject: 250° C. (523.15K)
Total pressure of vacuum tank: 5 Torr
Flow rate ratio of carrier gas (Ge:Sb:Te): 3:1:2
Concentration of material gas: 20%

The flow rate of each gas supplied to the vacuum tank 21 can be changed to change the concentration of the $NH_3$ gas. However, a change in the flow rate of each material gas greatly changes the formation speed of the GST layer. Thus, in an embodiment, the concentration ratio of the $NH_3$ gas is changed by fixing the flow rate of each material gas and the total flow rate of the gases supplied to the vacuum tank 21 while changing the flow rate of the $NH_3$ gas and the flow rate of the Ar gas.

After the crystalline GST layer is formed, the film formation conditions are changed to conditions that allow an amorphous GST layer to be obtained, and the remaining film formation time is used to form the amorphous GST layer. This forms the GST layer in the entire recess 42a.

The GST layer can be formed by increasing the film formation time by approximately 10% or greater and 20% or less. In this case, for example, the additional time added to the film formation time can be allocated to the time for forming the amorphous GST layer. This further ensures that the GST layer is formed in the entire recess 42a and increases the reproducibility of steps performed after the step of forming the GST layer.

In another manner, and per one embodiment, a crystalline phase-change layer that is formed differs in composition from an amorphous phase-change layer but includes an element that is also included in the amorphous phase-change layer. The crystalline GST layer and the amorphous GST layer are formed from different compositions. This increases the freedom for the composition of the entire phase-change layer.

For example, to form a crystalline phase-change layer that differs in composition from an amorphous phase-change layer but includes an element that is also included in the amorphous phase-change layer, the amount of each material gas supplied to the vacuum tank 21 can be changed to differ between when the crystalline GST layer is formed and when the amorphous GST layer is formed.

To change the supplied amount of each material gas, for example, the flow rate of the carrier gas supplied to each material container 31 to 33 can be changed and/or the supplying time of each material gas can be changed for each material gas. An example will now be described in which the supplied amount of each material gas is changed by changing the flow rate of the carrier gas supplied to each of the material containers 31 to 33 when the first material gas, the second material gas, the third material gas, the $NH_3$ gas, and the Ar gas are simultaneously being supplied.

A crystalline GST layer is obtained more easily as the ratio of Sb to Te, that is, Sb/Te is decreased. On the other hand, an amorphous GST layer is obtained more easily as Sb/Te is increased. The flow rate of the carrier gas supplied to the second material container 32 relative to the flow rate of the carrier gas supplied to the third material container 33 is the flow rate ratio of the material gas. For example, under the film formation conditions listed below, a crystalline GST layer can be obtained when the flow rate ratio of the material gas is ½ or less.

Namely, when Fte represents the flow rate of the carrier gas supplied to the third material container 33 and Fsb represents the flow rate of the carrier gas supplied to the second material container 32, a crystalline GST layer is obtained when expression (1), which is illustrated below, is satisfied.

$$Fsb/Fte \leq 1/2 \quad \text{Expression (1)}$$

An amorphous GST layer can be obtained when the flow rate ratio of the material gas is greater than ½, and in an embodiment greater than ⅔. Namely, the amorphous GST layer is obtained when expression (2), which is illustrated below, is satisfied. It one embodiment, expression (3), which is illustrated below, can be satisfied to obtain the amorphous GST layer.

$$Fsb/Fte > 1/2 \quad \text{Expression (2)}$$

$$Fsb/Fte > 2/3 \quad \text{Expression (3)}$$

In an embodiment, film Formation conditions are as follows:
Temperature of film formation subject: 250° C. (523.15K)
Total pressure of vacuum tank: 5 Torr
Concentration ratio of material gas: 20%
Concentration ratio of $NH_3$ gas: 7%

When forming the GST layer through the second method, the percentage of the film formation time occupied by the time for forming the crystalline GST layer and the percentage of the film formation time occupied by the time for forming the amorphous GST layer can be the same as the first method.

In yet another manner, and in an embodiment, the temperature of an insulation layer when forming a crystalline phase-change layer is set to be higher than the temperature of the insulation layer when forming an amorphous phase-change layer. That is, a crystalline phase-change layer and an amorphous phase-change layer can be formed by changing the temperature of the film formation subject so that the temperature differs between when the crystalline phase-change layer is formed and when the amorphous phase-change layer is formed. An example, in which the phase-change layer is a GST layer will now be described.

A crystalline GST layer is obtained more easily when the film formation subject has a higher temperature. An amorphous GST layer is obtained more easily when the film formation subject has a lower temperature.

For example, under the film formation conditions listed below, a crystalline GST layer can be obtained when the temperature of the film formation subject is 250° C. (523.15 K) or greater, and an amorphous GST layer can be obtained when the temperature of the film formation subject is 245° C. (518.15 K) or less.

In an embodiment, the film formation conditions can be:
Total pressure of vacuum tank: 5 Torr
Flow rate ratio of carrier gas (Ge:Sb:Te): 3:1:2
Concentration of material gas: 20%
Concentration ratio of $NH_3$ gas: 7%

When forming the GST layer through the third method, the percentage of the film formation time occupied by the time for forming the crystalline GST layer and the percentage of the film formation time occupied by the time for forming the GST layer can be the same as illustrated pursuant to at least one embodiment above.

To change the temperature of the film formation subject S from the temperature that obtains a crystalline GST layer to the temperature that obtains an amorphous GST layer, time is required for the temperature of the film formation subject to be saturated to the changed temperature.

Thus, to increase the productivity of the phase-change memory when forming the GST layer, in an embodiment, the manufacturing apparatus 10 can include a chamber that forms a GST layer at the temperature that obtains the crystalline GST layer and a separate chamber that forms a GST layer at the temperature that obtains the amorphous GST layer.

Experimental examples will now be described with reference to FIGS. 12 to 15.

Pursuant to at least one embodiment above, one or more methods was performed to form GST layers. Crystalline GST layers were obtained when the concentration ratio of the $NH_3$ gas was 0%, 3%, and 7%. Amorphous GST layers were obtained when concentration ratio of the $NH_3$ gas was 10%, 13%, and 20%. Conditions other than the partial pressure ratio of the $NH_3$ gas were set to the film formation conditions of the first method described above.

Pursuant to at yet another at least one embodiment above, one or more methods was performed to form GST layers. Crystalline GST layers were obtained when the flow rate ratio of material gas (Fsb/Fte) was 0.3, 0.35, and 0.45. Amorphous GST layers were obtained when the flow rate ratio of material gas was 0.5, 0.6, 0.66, and 0.75. Conditions other than the flow rate ratio of the material gas were set to the film formation conditions of the second method described above.

Pursuant to at yet another at least one embodiment above, one or more methods was performed to form GST layers. Crystalline GST layers were obtained when the temperature of the film formation subject was 270° C. (543.15 K), 260° C. (533.15 K), 250° C. (523.15 K), and 250° C. (573.15 K. Amorphous GST layers were obtained when the temperature of the film formation subject was 230° C. (503.15 K), 240° C. (513.15 K), and 245° C. (518.15 K). Conditions other than the temperature of the film formation subject were set to the film formation conditions of the third method described above.

Figure 12:
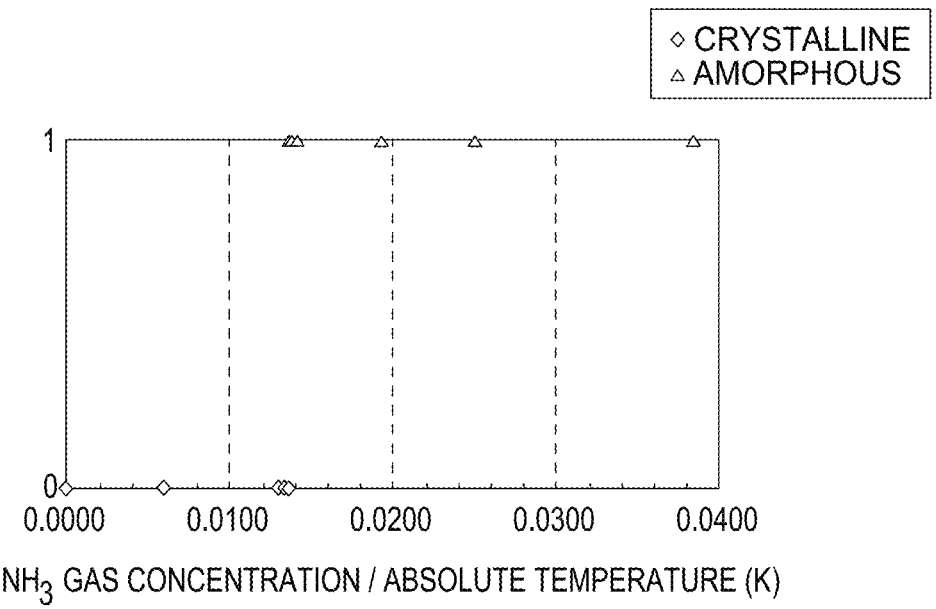
FIG. 12 is a graph illustrating the relationship of the germanium antimony telluride ($Ge_xSb_yTe_z$:GST) layer state and a value obtained by dividing the NH3 gas concentration by the film formation subject temperature in accordance with at least one embodiment of the present disclosure.

FIG. 12 is a graph illustrating the relationship of the state of the GST layer and a value obtained when dividing the concentration ratio of the $NH_3$ gas by the temperature (K) of the film formation subject for the film formation using the first method and the film formation using the third method. The horizontal axis represents the quotient. The vertical axis indicates "0" when a crystalline GST layer was obtained and "1" when an amorphous GST layer was obtained.

As illustrated in FIG. 12, crystalline GST layers were obtained when the quotient was 0.0134 or less, and amorphous GST layers were obtained when the quotient was 0.0135 or greater. Thus, the critical value at which the GST layer changed from the crystalline state to the amorphous state was 0.0134 that was obtained when dividing the concentration ratio of the $NH_3$ gas by the temperature of the film formation subject.

Figure 13:
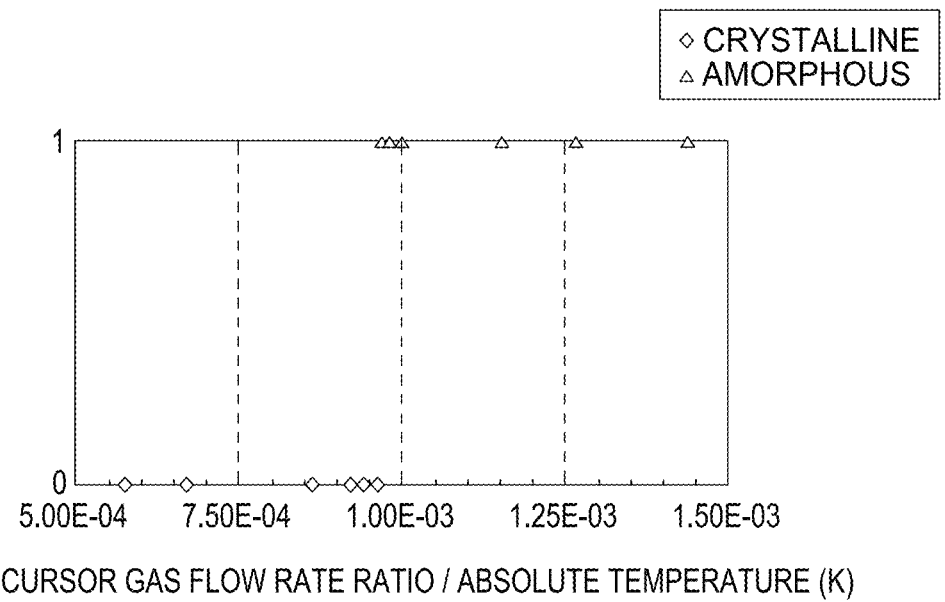
FIG. 13 is a graph illustrating the relationship of the GST layer state and a value obtained by dividing the material gas flow rate ratio by the film formation subject temperature in accordance with at least one embodiment of the present disclosure.

FIG. 13 is a graph illustrating the relationship of the state of the GST layer and a value obtained when dividing the flow rate ratio of the material gas by the temperature (K) of the film formation subject for the film formation using the second method and the film formation using the third method. The horizontal axis represents the quotient. The vertical axis indicates "0" when a crystalline GST layer was obtained and "1" when an amorphous GST layer was obtained.

As illustrated in FIG. 13, crystalline GST layers were obtained when the quotient was 9.56E-4 or less, and amorphous GST layers were obtained when the quotient was 9.56E-4 or greater. Thus, the critical value at which the GST layer changed from the crystalline state to the amorphous state was 9.56E-4 that was obtained when dividing the flow rate ratio of the material gas by the temperature of the film formation subject.

When forming the crystalline GST layer before the amorphous GST layer, based on the structure of the crystalline GST layer, the thickness of a crystalline GST layer satisfying expression (4), which is illustrated below, can be set as the upper limit value, and the thickness of a crystalline GST layer satisfying expression (5), which is illustrated below, can be set as the lower limit value. The surface roughness Ra is the arithmetic average roughness, and the surface roughness Rz is the maximum height roughness:

(radius of recess)=(thickness of GST layer)+(surface roughness Ra of GST layer)  Expression (4)

(radius of recess)=(thickness of GST layer)+(surface roughness Rz of GST layer)  Expression (5)

Figure 14:
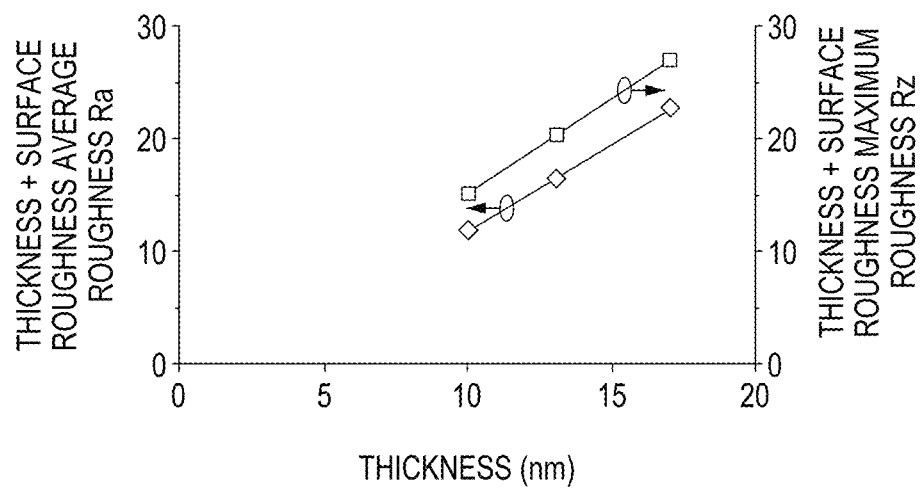
FIG. 14 is a graph illustrating the relationship of the thickness and the surface roughness of the GST layer in the crystalline state in accordance with at least one embodiment of the present disclosure.

FIG. 14 illustrates the relationship of the thickness and the surface roughness Ra of crystalline GST layers. FIG. 14 also illustrates the relationship of the thickness and the surface roughness Rz of crystalline GST layers.

As illustrated in FIG. 14, for example, when the recess 42a has a diameter of 30 nm and most of the cavity of the recess 42a is filled with a crystalline GST layer having a thickness of 10 nm, the sum of the thickness of the GST layer and the surface roughness Rz of the GST layer is equal to the radius of the recess 42a. When the crystalline GST layer has a thickness of 12 nm, the sum of the thickness of the GST layer and the surface roughness Ra of the GST layer is equal to the radius of the recess 42a. Accordingly, the thickness of the GST layer can be 10 nm or greater and 12 nm or less.

The thickness of the crystalline GST layer is set by the volume of the crystalline GST layer. Accordingly, to decrease the difference in volume between the GST layer prior to annealing and the GST layer subsequent to annealing, the thickness of the GST layer can be set so that the crystalline GST layer has a larger volume than the amorphous GST layer.

A film formation subject including two hundred recesses was prepared. Further, after forming a crystalline GST layer, an amorphous GST layer was formed to fill each recess with a GST layer. In this case, the GST layer was formed using the first method under the film formation conditions illustrated below.

Removing the portion of the GST layer located outside each recess takes place, forming the cap layer that closes the opening of the recess takes place, and annealing the GST layer takes place in order to obtain a memory intermediate body. When forming the GST layer, the crystalline GST layer was formed during a time that was 80% of the film formation time from when film formation started, and the amorphous GST layer was formed during the remaining time.

In an embodiment film formation conditions were as follows:

Diameter of recess: 30 nm
Depth of recess: 100 nm
Temperature of film formation subject: 250° C. (523.15K)
Total pressure of vacuum tank: 5 Torr
Flow rate ratio of carrier gas (Ge:Sb:Te): 3:1:2
Concentration of material gas: 20%
Concentration ratio of $NH_3$ gas (crystalline): 7%
Concentration ratio of $NH_3$ gas (amorphous): 10%

A memory intermediate body of experimental example 2 was obtained using the same method as experimental example 1 except in that only an amorphous GST layer was formed to fill each recess with the GST layer.

Figure 15:
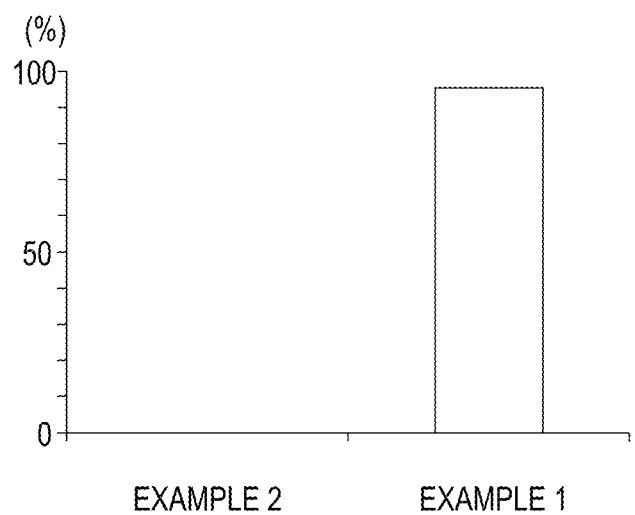
FIG. 15 is a graph illustrating the percentage of recesses that are free from voids in the phase-change layer of experimental example 1 and experimental example 2 and in accordance with at least one embodiment of the present disclosure.

As illustrated in FIG. 15, in the memory intermediate body of experimental example 1, the percentage of recesses free from voids in the phase-change layer was 97%. In the memory intermediate body of experimental example 2, the percentage of recesses free from voids in the memory intermediate body of experimental example 2 was 0%. In other words, in the memory intermediate body of experimental example 2, every one of the recesses in the phase-change layer included a void.

When forming a GST layer with the second method and when forming a GST layer with the third method, the same tendency as the first method was obtained when filling the recess with the GST layer by forming the amorphous GST layer after forming the crystalline GST layer.

The amorphous layer 46 and the crystalline layer 45 are formed at different positions in the recess 42a. Thus, compared to when forming only the amorphous layer 46, the difference in the volume of the phase-change layer can be decreased between when the phase-change layer is formed and when the entire phase-change layer is crystallized. This obviates the formation of a void in the region (recess 42a) filled with the phase-change layer that would be caused by a decrease in the volume of the phase-change layer.

The amorphous layer 46 is formed after the crystalline layer 45 is formed in the recess 42a. Thus, even though the crystalline layer 45 includes a void, the void is filled by the amorphous layer 46. This completely fills the recess 42a.

The phase-change layer is formed so that the crystalline layer 45 has a larger volume than the amorphous layer 46. Thus, the difference in the volume of the phase-change layer can be decreased between when the phase-change layer is formed and when the entire phase-change layer is crystallized. This obviates the formation of a void in the region (recess 42a) filled with the phase-change layer that would be caused by a decrease in the volume of the phase-change layer.

The second method forms the crystalline layer 45 and the amorphous layer 46 with different compositions. This increases the freedom for the composition of the entire phase-change layer.

The third method changes the temperature of the film formation subject S so that the temperature differs when forming the crystalline layer 45 and when forming the amorphous layer 46. This more easily forms the crystalline layer 45 and the amorphous layer 46.

At least one embodiment as described above can be modified as described below. The thickness of the crystalline GST layer can be less than 10 nm or greater than 12 nm. Even in such a configuration, advantage (1) can be obtained as long as the crystalline GST layer and the amorphous GST layer are located at different positions in the recess. Further, the formation of the amorphous GST layer after the formation of the crystalline GST layer obtains advantage (2). The volume of the crystalline phase-change layer can be smaller than the volume of the amorphous phase-change layer. Even in such a configuration, the formation of the crystalline GST layer before the formation of the amorphous GST layer obtains advantage (2).

The phase-change layer does not have to be formed from $Ge_xSb_yTe_z$ as described above and can be formed from any material that switches between a crystalline state and an amorphous state and exhibits resistances that differ between the crystalline state and the amorphous state. For example, the phase-change layer can be formed from any one of Ga—Sb—Ge, In—Se, Sb—Te, Ge—Te, Ge—Cu—Te, In—Sb—Te, Ga—Se—Te, Ge—Sn—Se, Sn—Sb—Te, In—Sb—Ge, Ag—In—Sb—Te, (Ge—Sn)—Sb—Te, Ge—Sb—(Se—Te), and Te—Ge—Sb—S or a material obtained by adding N, O, or Si to any one of the above substances. These substances include those in which the relationship of the volume in the crystalline state and the volume in the amorphous state is reversed from $Ge_xSb_yTe_z$. However, the percentage of the amorphous substance and the percentage of the crystalline substance in the recess can be adjusted so that the volume after a heat treatment is performed is larger than the volume before the heat treatment is performed and so that the change in volume is minimized.

The reactive gas is not limited to $NH_3$ gas and can be, for example, $H_2$ gas. The reactive gas only needs to allow the phase-change layer to be formed when supplied to the vacuum tank 21 together with the material gas.

The carrier gas is not limited to Ar gas and can be, for example, Ne gas or Kr gas. The carrier gas only needs to supply organic metal material to the vacuum tank 21.

The diluting gas is not limited to Ar gas and can be an inert gas such as Ne gas or Kr gas.

Yet another embodiment of a method for manufacturing a phase-change memory will now be described with reference to FIGS. 16 to 18. This embodiment differs from the at least one embodiment above in the order in which the amorphous phase-change layer and the crystalline phase-change layer are formed. The differences between at least one embodiment above and this embodiment will be described below in detail. Same reference numerals are given to those components that are the same as the corresponding components of at least one embodiment described above. Such components will not be described in detail. A method for manufacturing a phase-change memory, a method for forming a phase-change film, and experimental examples will be described hereafter.

At least one method for manufacturing a phase-change memory will now be described with reference to FIGS. 16 and 17.

Figure 16:
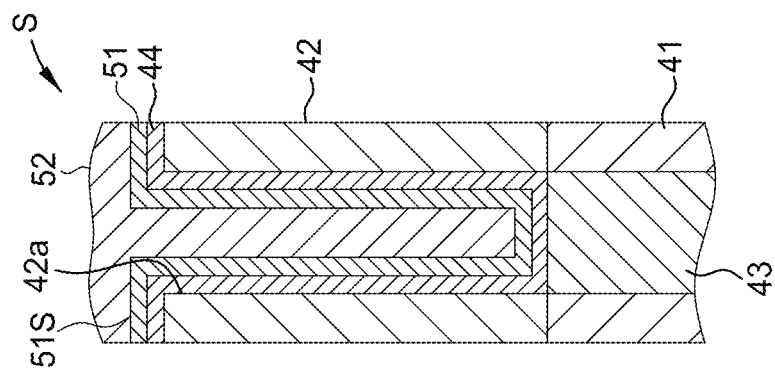
FIG. 16 is a cross-sectional view that illustrates formation of an amorphous layer for a phase-change memory in accordance with at least one embodiment of the present disclosure.
Figure 17:
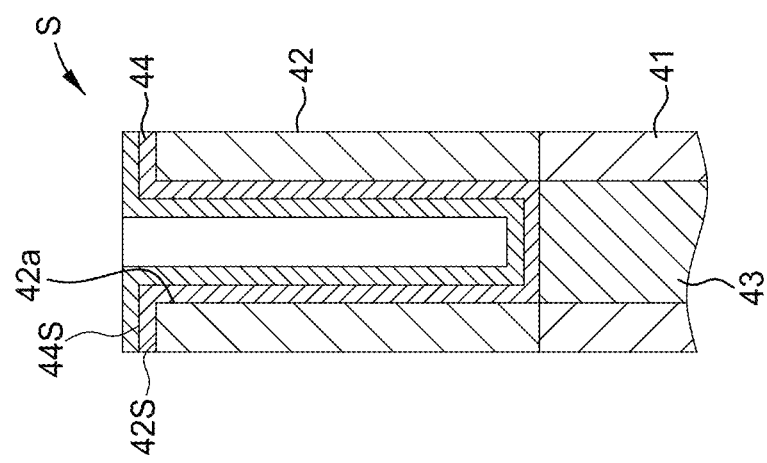
FIG. 17 is a cross-sectional view that illustrates formation of a crystalline layer for a phase-change memory in accordance with at least one embodiment of the present disclosure.

In at least one embodiment associated with FIGS. 16 and 17, after an amorphous phase-change layer is formed, a crystalline phase-change layer is formed.

In the same manner as the phase-change memory described above, a film formation subject S is prepared, and a liner layer 44 is formed on the film formation subject S.

Subsequently, as illustrated in FIG. 16, an amorphous layer 51, which is an amorphous phase-change layer, is formed at a second position in a recess 42a.

In an embodiment, the second position in the recess 42a at which the amorphous layer 51 is formed refers to the surface portion (portion of surface 44S) of the liner layer 44 that is located inside the recess 42a. The amorphous layer 51 is also formed on the surface portion (remaining portion of surface 44S) of the liner layer 44 that is located outside the recess 42a on the surface 42S of the second insulation layer 42. Thus, the amorphous layer 51 is formed on the entire surface 44S of the liner layer 44.

The amorphous layer 51 has a smaller surface roughness than a crystalline phase-change layer. Thus, the formation of the amorphous layer 51 on the surface 44S of the liner layer 44 obtains a flatter layer on the liner layer 44.

Then, as illustrated in FIG. 17, a crystalline layer 52, which is a crystalline phase-change layer, is formed at a first position in the recess 42a. The amorphous layer 51 includes a surface 51S. The surface 51S of the amorphous layer 51 includes a surface portion (surface opposite to surface contacting liner layer 44) where the amorphous layer 51 is located outside the recess 42a and a surface portion (surface opposite to surface contacting liner layer 44) where the amorphous layer 51 is located inside the recess 42a.

In an embodiment, the first position in the recess 42a at which the crystalline layer 52 is formed refers to the surface portion (portion of surface 51S) of the amorphous layer 51 located inside the recess 42a. The crystalline layer 52 is also formed on the surface portion (remaining portion of surface 51S) of the amorphous layer 51 located outside the recess 42a. Thus, the crystalline layer 52 is formed on the entire surface 51S of the amorphous layer 51. This fills the cavity of the recess 42a with the amorphous layer 51 and the crystalline layer 52 excluding the liner layer 44.

The formation of the crystalline layer 52 on the amorphous layer 51 reduces differences in crystalline nucleation during the initial formation stage of the crystalline phase-change layer 52 as compared to when the crystalline layer 52 is formed when there is no amorphous layer 51. This allows the crystalline layer 52 to be formed with a higher degree of flatness than when there is no amorphous layer and thus obviates the formation of a void in the region filled with the phase-change layer.

In the same manner as at least one embodiment described above, the amorphous layer 51 and the crystalline layer 52 can be formed so that the amorphous layer 51 has a smaller volume than the crystalline layer 52 inside the recess 42a.

Upon completion of the formation of the amorphous layer 51 and the formation of the crystalline layer 52, the steps illustrated in FIGS. 7 to 11 are performed to manufacture the phase-change memory.

In an embodiment, an amorphous GST layer is formed during a time that is 10% or greater and 50% or less of the film formation time, where in an embodiment it can be 10% or greater and 40% or less of the film formation time under film formation conditions that can obtain the amorphous GST layer.

After the formation time of the amorphous GST layer elapses, the remaining film formation time can be used to form a crystalline GST layer by changing the film formation conditions from conditions that obtain an amorphous GST layer to conditions that obtain a crystalline GST layer. This forms a GST layer in the entire recess 42a.

In the same manner as at last one embodiment described above, the GST layer can be formed by increasing the film formation time by approximately 10% or greater and 20% or less. In this case, for example, the additional time added to the film formation time can be allocated to the time for forming the crystalline GST layer. This further ensures that the GST layer is formed in the entire recess 42a and increases the reproducibility of steps performed after the step of forming the GST layer.

When forming the GST layer, in an embodiment, the percentage of the film formation time occupied by the time for forming the amorphous GST layer and the percentage of the film formation time occupied by the time for forming the crystalline GST layer can be the same as the first method.

In an embodiment, when the crystalline GST layer is formed after the amorphous GST layer is formed, it the lower limit value of the thickness of the amorphous GST layer can be set to decrease the surface roughness of the crystalline GST layer formed on the surface of the amorphous GST layer.

When the amorphous GST layer has a thickness of 3 nm or greater, a decrease in the surface roughness of the crystalline GST layer is ensured. Thus, in an embodiment, the thickness of the amorphous GST layer can be 3 nm or greater.

The upper limit value of the thickness of the amorphous GST layer is in accordance with the volume of the amorphous GST layer. To decrease the difference in volume between the GST layer prior to annealing and the GST layer subsequent to annealing, in an embodiment, prior to annealing, the volume of the crystalline GST layer be greater than the volume of the amorphous GST layer.

The surface roughness Ra of the crystalline GST layer restricts the filling of the recess with the crystalline GST layer. Accordingly, in an embodiment the volume of a cylindrical portion obtained by excluding the thickness corresponding to the surface roughness Ra from the crystalline GST layer can be greater than the volume of the amorphous GST layer.

For example, when the diameter of the recess is 30 nm and the thickness of the crystalline GST layer is 5 nm, the GST layer has a surface thickness Ra of approximately 5 nm. Thus, when the crystalline GST has a radius of 10 nm, in an embodiment, the volume of the crystalline GST layer excluding the thickness corresponding to the surface roughness from the crystalline GST layer can be greater than the volume of the amorphous GST layer. The thickness of the amorphous GST layer that satisfies such a condition has an upper limit value of 7 nm.

Thus, in an embodiment, when the amorphous GST layer is formed before the crystalline GST layer, the thickness of the amorphous GST layer is 3 nm or greater and 7 nm or less.

A GST layer was obtained in experimental example 3 using the same method as experimental example 1 except in that the crystalline GST layer was formed after the amorphous GST layer was formed, the amorphous GST layer was formed during a time that was 20% of the film formation time from when film formation started, and the crystalline GST layer was formed during the remaining time.

Figure 18:
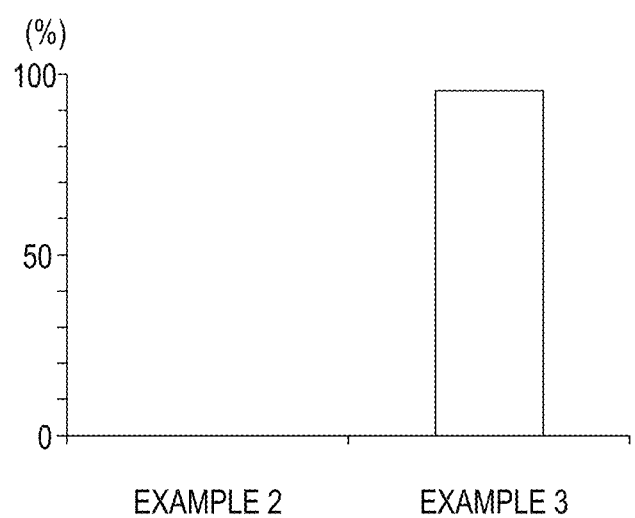
FIG. 18 is a graph illustrating the percentage of recesses that are free from voids in the phase-change layer of experimental example 2 and experimental example 3 and in accordance with at least one embodiment of the present disclosure.

As illustrated in FIG. 18, in experimental example 2, the percentage of recesses free from voids in the GST layer was 0% (i.e., every one of the GST layers included a void). In experimental example 3, the percentage of recesses free from voids in the GST layer was 93%.

When forming a GST layer with the second method and the third method, the same tendency as the first method was obtained when filling the recess with the GST layer by forming the crystalline GST layer after forming the amorphous GST layer.

In addition to at least on advantage described above, the formation of the crystalline layer 52 on the amorphous layer 51 reduces differences in crystalline nucleation during the initial formation stage of the crystalline layer 52. This allows the crystalline layer 52 to be formed with a higher degree of flatness and thus obviates the formation of a void in the region (recess 42a) filled with the phase-change layer.

In one embodiment, the thickness of the amorphous GST layer can be adjusted and can be less than 3 nm or greater than 7 nm. Such thicknesses may at least decrease the surface roughness of the crystalline GST layer as compared with when the crystalline GST layer is directly formed on the surface of the liner layer 44. Further, when the GST layer is formed by the crystalline GST layer and the amorphous GST layer, voids are reduced in the region (recess 42a) filled with the GST layer as compared with when the entire GST layer is formed by only an amorphous layer. That is, advantages (1) and (6) are obtained.

The crystalline phase-change layer may have a smaller volume than the amorphous phase-change layer. Such a configuration also forms the amorphous phase-change layer before the crystalline phase-change layer and obtains advantage (6).

In the same manner as at least one embodiment described above, the phase-change layer can be formed from a phase-change material other than that used for the GST layer. Further, the reactive gas, the carrier gas, and the diluting gas can be the gases described in the modified examples of at least one embodiment described above.

Yet at least one more embodiment of a method for manufacturing a phase-change memory will now be described with reference to FIGS. 19 to 21. At least one embodiment illustrated therein differ from at least one embodiment described above in that the number of times an amorphous phase-change layer is formed. Same reference numerals are given to those components that are the same as the corresponding components described above, without additional details.

A method for manufacturing a phase-change memory will now be described with reference to FIGS. 19 to 21. In an embodiment, a first amorphous phase-change layer is first formed. After a crystalline phase-change layer is formed, a second amorphous phase-change layer is further formed. The second amorphous phase-change layer is formed in the recess at a third portion that differs from the first position and the second position.

In one embodiment, as above and in the same manner as the phase-change memory of at least one embodiment described above, a film formation subject S is prepared and a liner layer 44 is formed on the film formation subject S.

Figure 19:
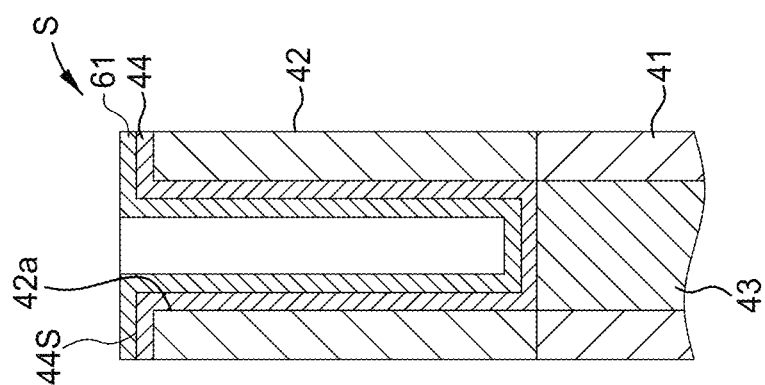
FIG. 19 is a cross-sectional view that illustrates formation of a first amorphous layer of a phase-change memory in accordance with at least one embodiment of the present disclosure.

As illustrated in FIG. 19, a first amorphous layer 61, which is a first amorphous phase-change layer, is formed at a second position in the recess 42a.

In an embodiment, the second position in the recess 42a at which the first amorphous layer 61 is formed refers to the surface portion (portion of surface 44S) of the liner layer 44 located inside the recess 42a. The first amorphous layer 61 is also formed on the surface portion (remaining portion of surface 44S) of the liner layer 44 located outside the recess 42a. That is, the first amorphous layer 61 is formed on the entire surface 44S of the liner layer 44 in the same manner as the amorphous layer 51 as discussed above with respect to another embodiment.

Figure 20:
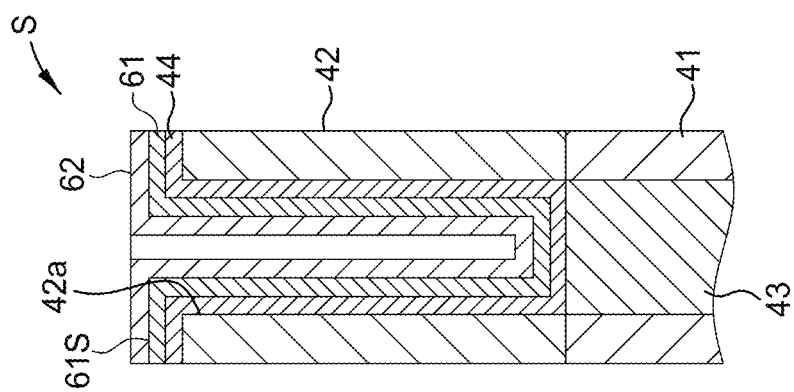
FIG. 20 is a cross-sectional view that illustrates formation of a crystalline layer for a phase-change memory in accordance with at least one embodiment of the present disclosure.

Then, as illustrated in FIG. 20, the crystalline layer 62, which is a crystalline phase-change layer, is formed at a first position in the recess 42a.

In one embodiment, the first position in the recess 42a at which the crystalline layer 62 is formed refers to the surface portion (portion of surface 61S) of the first amorphous layer 61 located inside the recess 42a. The crystalline layer 62 is also formed on the surface portion (remaining portion of surface 61S) of the first amorphous layer 61 located outside the recess 42a. That is, the crystalline layer 62 is formed on the entire surface 61S of the first amorphous layer 61 in the same manner as the crystalline layer 52 of the as at least one embodiment described above.

The crystalline layer 62 differs from the crystalline layer 52 of at least one embodiment described above in that the crystalline layer 62 is not formed in the entire opening defined by the surface 61S of the first amorphous layer 61 in the recess 42a. In other words, the crystalline layer 62 is formed with a thickness that leaves an empty space in the recess 42a.

Figure 21:
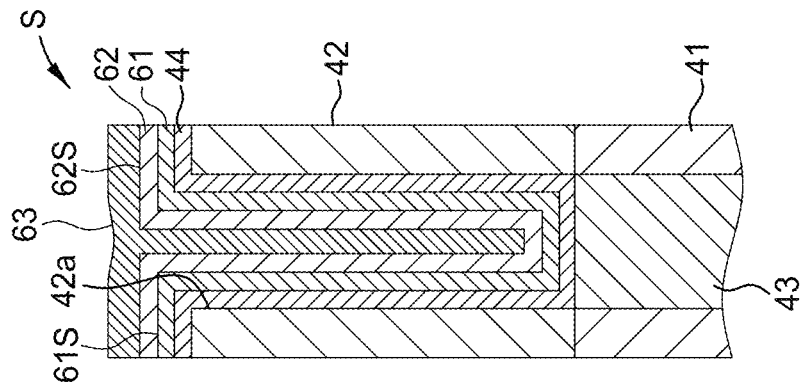
FIG. 21 is a cross-sectional view that illustrates of formation of an amorphous layer in accordance with at least one embodiment of the present disclosure.

Then, as illustrated in FIG. 21, a second amorphous layer 63 that is an amorphous phase-change layer is formed in the recess 42a at a third position. The crystalline layer 62 includes a surface 62S. The surface 62S of the crystalline layer 62 includes a surface portion (surface opposite to surface contacting first amorphous layer 61) located outside the recess 42a and a surface portion (surface opposite to surface contacting first amorphous layer 61) located inside the recess 42a.

In one embodiment, the third position in the recess 42a at which the second amorphous layer 63 is formed refers to the surface portion (portion of surface 62S) of the crystalline layer 62 located inside the recess 42a. The second amorphous layer 63 is also formed on the surface portion (remaining portion of surface 62S) of the crystalline layer 62 located outside the recess 42a. That is, the second amorphous layer 63 is formed on the entire surface 62S of the crystalline layer 62. This fills the cavity of the recess 42a with the first amorphous layer 61, the crystalline layer 62, and the second amorphous layer 63, excluding the liner layer 44.

This forms the crystalline layer 62 with an increased flatness and further forms the second amorphous layer 63 on the crystalline layer 62. Thus, even when a void is formed in the crystalline layer 62, the void can be filled with the amorphous layer 63. This further reduces voids in the region (recess 42a) filled with the phase-change layer.

In the same manner as the at least one embodiment describe above, one or more techniques can be performed to form the phase-change layer. Upon completion of the formation of the first amorphous layer 61, the formation of the crystalline layer 62, and the formation of the second amorphous layer 63, the steps illustrated in FIGS. 7 to 11 are performed to manufacture the phase-change memory.

In addition to one or more advantages described above, this embodiment has an advantage in that the amorphous layer 63 is formed after forming the crystalline layer 62 that has increased flatness. Thus, even when a void is formed in the crystalline layer 62, the void can be filled with the second amorphous layer 63.

In the same manner as at least one embodiment described above, the phase-change layer can be formed from a phase-change material other than that used for the GST layer. Further, the reactive gas, the carrier gas, and the diluting gas can be the gases described in one or more modified examples described above.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the spirit and scope of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention can be devised without departing from the basic scope thereof, and the scope thereof is determined by the claims that follow.

What is claimed is:

1. A method for manufacturing a phase-change memory the method comprising:
    forming a crystalline phase-change layer at a first position within a recess of an insulation layer; and
    forming an amorphous phase-change layer at second position which differs from the first position within the recess; and
    forming a recess liner layer that bounds side and bottom portions of the recess.

2. The method according to claim 1, wherein forming the amorphous phase-change layer is performed after forming the crystalline phase-change layer.

3. The method according to claim 1, wherein forming the crystalline phase-change layer is performed after forming the amorphous phase-change layer.

4. The method according to claim 3, wherein
    forming the amorphous phase-change layer includes forming a first amorphous phase-change layer, and
    the method further comprises forming a second amorphous phase-change layer at a third position in the recess after forming the crystalline phase-change layer, wherein the third position differs from the first position and the second position.

5. The method according to claim 1, wherein
    forming the crystalline phase-change layer and forming the amorphous phase-change layer fills a cavity defined by the recess with the crystalline phase-change layer and the amorphous phase-change layer, and the amorphous phase-change layer and the crystalline phase-change layer are formed in the cavity of the recess so that the amorphous phase-change layer has a smaller volume than the crystalline phase-change layer.

6. The method according to claim 1, wherein forming the crystalline phase-change layer comprises:
forming the crystalline phase-change layer with a different material composition than the amorphous phase-change layer but includes elements that are also included in the amorphous phase-change layer.

7. The method according to claim 1, wherein the insulation layer is set to have a higher temperature when the crystalline phase-change layer is formed than when the amorphous phase-change layer is formed.

8. A method comprising:
forming a crystalline phase-change layer at a first position within a recess along a surface of a first semiconductor layer;
forming an amorphous phase-change layer at a second position within the recess, wherein the crystalline phase-change layer and the amorphous phase-change layer contact; and
forming a recess liner layer that bounds side and bottom portions of the recess.

9. The method according to claim 8 further comprising:
forming a single polycrystalline phase-change layer from the amorphous phase-change layer and the the crystalline phase-change layer.

10. The method according to claim 9 further comprising:
forming a first electrode and a second electrode in contact with the single polycrstalline phase-change layer.

11. The method according to claim 8, wherein forming the crystalline phase-change layer is performed after forming the amorphous phase-change layer.

12. The method according to claim 11 further comprising:
forming a liner in contact with the crystalline phase-change layer without contacting the amorphous-change layer; and
forming a first electrode in contact with the liner.

13. The method according to claim 12 further comprising:
forming a single polycrystalline phase-change layer from the amorphous phase-change layer and the the crystalline phase-change layer, wherein the single polycrstalline phase-change layer is in contact with the liner.

14. The method according to claim 13, wherein forming the single polycrystalline phase-change layer from the amorphous phase-change layer and the the crystalline phase-change layer comprises:
heating the amorphous phase-change layer and the crystalline phase-change layer to a crystalline temperature or higher.

15. The method according to claim 14 further comprising:
forming a second electrode over the single polycrstalline phase-change layer.

16. The method according to claim 12, wherein the single polycrstalline phase-change layer is between ninety-three percent to ninety-seven percent void free.

17. The method according to claim 12, wherein the single polycrstalline phase-change layer is approximately ninety-seven percent void free.

18. The method according to claim 12, wherein the single polycrstalline phase-change layer is a germanium antimony telluride ($Ge_xSb_yTe_z$:GST) layer.

* * * * *